US010402509B2

(12) United States Patent
Hanselmann et al.

(10) Patent No.: US 10,402,509 B2
(45) Date of Patent: Sep. 3, 2019

(54) METHOD AND DEVICE FOR ASCERTAINING A GRADIENT OF A DATA-BASED FUNCTION MODEL

(71) Applicant: Robert Bosch GmbH, Stuttgart (DE)

(72) Inventors: Michael Hanselmann, Korntal (DE); Jan Mathias Koehler, Stuttgart (DE); Heiner Markert, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1055 days.

(21) Appl. No.: 14/558,544

(22) Filed: Dec. 2, 2014

(65) Prior Publication Data

US 2015/0154329 A1 Jun. 4, 2015

(30) Foreign Application Priority Data

Dec. 3, 2013 (DE) ........................ 10 2013 224 694

(51) Int. Cl.

| | |
|---|---|
| ***G06F 7/60*** | (2006.01) |
| ***G06F 17/50*** | (2006.01) |
| ***F02D 41/28*** | (2006.01) |
| ***G06F 17/17*** | (2006.01) |
| ***F02D 41/14*** | (2006.01) |
| ***F02D 41/24*** | (2006.01) |

(52) U.S. Cl.

CPC ..... *G06F 17/5009* (2013.01); *F02D 41/1402* (2013.01); *F02D 41/2438* (2013.01); *F02D 41/2477* (2013.01); *F02D 41/28* (2013.01); *G06F 17/17* (2013.01); *F02D 2041/1433* (2013.01)

(58) Field of Classification Search

CPC .................................................. G06F 17/5009

USPC ............................................................. 703/2

See application file for complete search history.

(56) References Cited

U.S. PATENT DOCUMENTS

| | | | | |
|---|---|---|---|---|
| 2009/0150308 A1* | 6/2009 | Wang | G06K 9/6278 706/12 |
| 2011/0257949 A1 | 10/2011 | Vasudevan et al. | |
| 2011/0282517 A1* | 11/2011 | Streichert | F02D 41/28 701/1 |

FOREIGN PATENT DOCUMENTS

| | | |
|---|---|---|
| DE | 102009000783 A1 | 3/2010 |
| DE | 10 2010 028 259 | 10/2011 |
| RU | 2012102394 A | 7/2013 |

* cited by examiner

*Primary Examiner* — Timothy A Mudrick

(74) *Attorney, Agent, or Firm* — Norton Rose Fulbright US LLP; Gerard Messina

(57) ABSTRACT

In a method for calculating a gradient of a data-based function model, having one or multiple accumulated data-based partial function models, e.g., Gaussian process models, a model calculation unit is provided, which is designed to calculate function values of the data-based function model having an exponential function, summation functions, and multiplication functions in two loop operations in a hardware-based way, the model calculation unit being used to calculate the gradient of the data-based function model for a desired value of a predefined input variable.

17 Claims, 3 Drawing Sheets

METHOD AND DEVICE FOR ASCERTAINING A GRADIENT OF A DATA-BASED FUNCTION MODEL

BACKGROUND OF THE INVENTION

1. Field of the Invention

The present invention relates to methods for ascertaining a gradient of a data-based function model, in particular using a control module having a hardware unit, which is designed to calculate the data-based function model in a hard-wired way.

2. Description of the Related Art

Data-based function models may be provided for implementing function models in control units, in particular in engine control units for internal combustion engines. Data-based function models are also referred to as parameter-free models and may be prepared without specific inputs from training data, i.e., a set of training data points.

Control modules having a main computing unit and a separate model calculation unit for calculating data-based function models in a control unit are known from the related art. Thus, for example, the published German patent application document DE 10 2010 028 259 A1 describes a control unit having an additional logic circuit as a model calculation unit which is designed for calculating exponential functions to assist in carrying out Bayesian regression methods, which are required in particular for calculating Gaussian process models.

The model calculation unit is designed as a whole for carrying out mathematical processes for calculating the data-based function model based on parameters and supporting points or training data. In particular, the functions of the model calculation unit are implemented solely in hardware for efficient calculation of exponential and summation functions, so that it is made possible to calculate Gaussian process models at a higher computing speed than may be carried out in the software-controlled main computing unit.

For many applications, the calculation of function values of data-based function models in control units, in particular for internal combustion engines, is sufficient. However, applications are known in which a gradient of a data-based function model is necessary, in particular to calculate an inverse data-based function model therewith.

BRIEF SUMMARY OF THE INVENTION

According to a first aspect, a method is provided for calculating a gradient of a data-based function model, in particular a Gaussian process model. A model calculation unit is designed to calculate a function value of the data-based function model using an exponential function, summation functions, and multiplication functions in two nested loop operations in a hardware-based way, the model calculation unit being used for calculating the gradient of the data-based function model for a desired value of a predefined input variable.

One idea of the above method is to carry out the calculation of a gradient of a data-based function model, essentially the existing algorithms implemented in hardware being used for calculating the function value of the data-based function model. This enables the calculation of the gradient for the data-based function model to be carried out on a hardware-based model calculation unit, in which the algorithm for calculating the data-based function model is implemented essentially permanently wired, i.e., in hardware. Due to the simplified calculation of the gradient of the data-based function model, it is possible, in particular with the aid of a Newtonian iteration method, to calculate a backward model, in which a numeric inversion may be carried out locally for a given target value with respect to a fixed input dimension.

Furthermore, it may be provided that the data-based function model is defined by supporting point data, hyperparameters, and a parameter vector, the parameter vector containing a number of elements which corresponds to the number of the supporting point data points, for calculating the gradient of the data-based function model for the desired value of the predefined input variable, the data-based function model being modified by applying a weighting vector, which is dependent on supporting point data points, to the parameter vector.

According to another specific embodiment, the gradient of the data-based function model may be calculated as a function value of the modified data-based function model for the desired value of the predefined input variable in the model calculation unit and an offset value may be added.

Furthermore, if the supporting point data points are scaled, the result of the sum of the function value of the modified data-based function model and the offset value may be multiplied by a factor, which is based on the standard deviation of the supporting point data with regard to the output data, to obtain the gradient of the data-based function model.

A weighting vector, which is dependent on supporting point data points, may be repeatedly applied to the parameter vector during a calculation of the modified data-based function model.

According to one specific embodiment, the data-based function model may be defined by supporting point data, hyperparameters, and a parameter vector, the parameter vector containing a number of elements which corresponds to the number of the supporting point data points, the data-based function model being modified for calculating the gradient of the data-based function model with regard to a predefined input variable by calculating the function value of the data-based function model in the model calculation unit for a desired value of the predefined input variable, multiplying the result with the desired value of the predefined input variable, and subsequently carrying out a renewed calculation of the data-based function model using a changed parameter vector in the model calculation unit.

According to another aspect, a method for carrying out a Newtonian iteration method for a data-based function model in a control module having a main computing unit and a model calculation unit is provided, the model calculation unit being designed to calculate in a hardware-based way function values of the data-based function model using an exponential function, summation functions, and multiplication functions in two loop operations, a gradient of the data-based function model being ascertained according to the above method and the data-based function model being calculated with the aid of the model calculation unit.

Furthermore, the gradient of the data-based function model may be calculated in a first computing core of the model calculation unit and the function value of the data-based function model may be calculated in a second computing core of the model calculation unit.

According to another aspect, a device, in particular a control module having a main computing unit and a model calculation unit is provided, the model calculation unit being designed to calculate function values of the data-based function model using an exponential function, summation functions, and multiplication functions in two loop operations in a hardware-based way, the device being designed to carry out the above method.

DETAILED DESCRIPTION OF THE INVENTION

Figure 1:
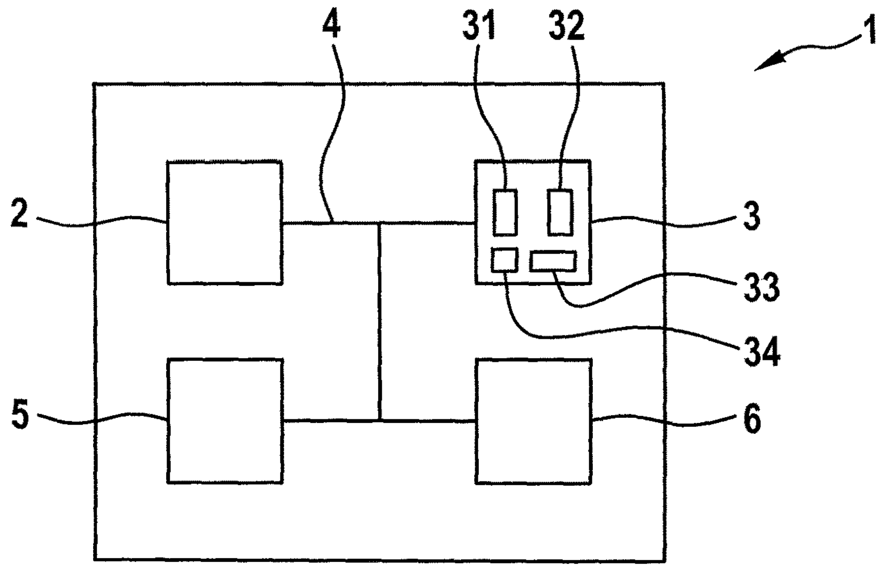
FIG. 1 shows a schematic view of an integrated control module having a main computing unit and a separate model calculation unit.

FIG. 1 shows a schematic view of a hardware architecture for an integrated control module 1, for example, in the form of a microcontroller, in which a main computing unit 2 and a separate model calculation unit 3 are provided in an integrated way for the solely hardware-based calculation of a data-based function model. Main computing unit 2 and model calculation unit 3 have a communication link to one another via an internal communication link 4, for example, a system bus.

Model calculation unit 3 is basically essentially hardwired and accordingly is not designed like main computing unit 2 for carrying out a software code. Alternatively, an approach is possible in which model calculation unit 3 provides a restricted, highly specialized command set for calculating the data-based function model. Model calculation unit 3 is designed as a specialized computing unit only for calculating predetermined computing processes. This enables resource-optimized implementation of such a model calculation unit 3 or a surface-optimized configuration in integrated architecture.

Model calculation unit 3 has a number of computing cores; thus, for example, in the exemplary embodiment shown in FIG. 1, a first computing core 31 and a second computing core 32 each implement a calculation of a predefined algorithm solely in hardware. Model calculation unit 3 may furthermore include a local SRAM memory 33 for storing the configuration data. Model calculation unit 3 may also include a local DMA unit 34 (DMA=direct memory access). With the aid of local DMA unit 34 it is possible to access the integrated resources of control module 1, in particular internal memory 5.

Control module 1 may include an internal memory 5 and a further DMA unit 6 (DMA=direct memory access). Internal memory 5 and further DMA unit 6 are connected to one another in a suitable way, for example, via internal communication link 4. Internal memory 5 may include a shared SRAM memory (for main computing unit 2, model calculation unit 3, and optionally further units) and a flash memory for the configuration data (parameters and supporting point data).

The use of nonparametric, data-based function models is based on a Bayesian regression method. The fundamentals of Bayesian regression are described, for example, in C. E. Rasmussen et al., "Gaussian Processes for Machine Learning," MIT Press 2006. Bayesian regression is a data-based method which is based on a model. To prepare the model, measuring points of training data and associated output data of an output variable to be modeled are required. The preparation of the model is carried out based on the use of supporting point data, which entirely or partially correspond to the training data or are generated therefrom. Furthermore, abstract hyperparameters are determined, which parameterize the space of the model functions and effectively weight the influence of the individual measuring points of the training data on the later model prediction.

The abstract hyperparameters are determined by an optimization method. One possibility for such an optimization method is an optimization of a marginal likelihood p(Y|H, X). Marginal likelihood p(Y|H, X) describes the plausibility of the measured y values of the training data, represented as vector Y, given model parameters H and the x values of the training data. In model training, p(Y|H, X) is maximized by searching for suitable hyperparameters which result in a curve of the model function determined by the hyperparameters and the training data and which image the training data as precisely as possible. To simplify the calculation, the logarithm of p(Y|H, X) is maximized, since the logarithm does not change the consistency of the plausibility function.

Figure 2:
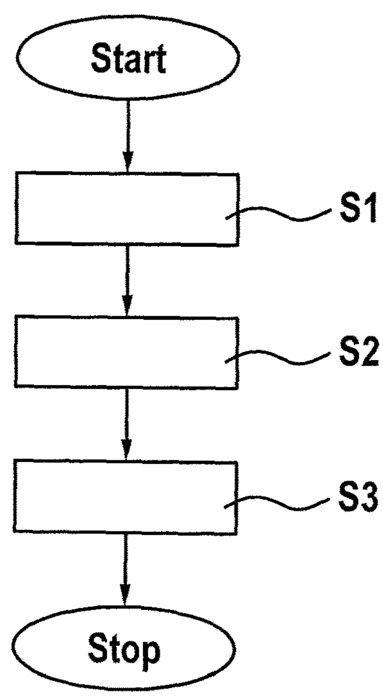
FIG. 2 shows a flow chart to illustrate a method for ascertaining a gradient of the data-based function model.

The calculation of the Gaussian process model takes place according to the steps which are schematically shown in FIG. 2. Input values $\tilde{x}_d$ for a test point x (input variable vector) may first be scaled, specifically according to the following formula:

$$x_d = \frac{\tilde{x}_d - (m_x)_d}{(s_x)_d}$$

In this formula, $m_x$ corresponds to the mean value function with respect to a mean value of the input values of the supporting point data, $s_x$ corresponds to the variance of the input values of the supporting point data, and d corresponds to the index for dimension D of test point x.

The following equation is obtained as the result of the preparation of the nonparametric, data-based function model:

$$v = \sum_{i=1}^{N} (Q_y)_i \sigma_f \exp\left(-\frac{1}{2}\sum_{d=1}^{D} \frac{(X_{i,d} - x_d)^2}{l_d}\right)$$

Model value v thus ascertained is scaled with the aid of an output scaling, specifically according to the following formula:

$$\tilde{v} = v s_y + m_y$$

In this formula, v corresponds to a scaled model value (output value) at a scaled test point x (input variable vector of dimension D), $\tilde{v}$ corresponds to a (non-scaled) model value (output value) at a (non-scaled) test point $\tilde{x}$ (input variable vector of dimension D), $x_i$ corresponds to a supporting point of the supporting point data, N corresponds to the number of the supporting points of the supporting point data, D corresponds to the dimension of the input data/training data/supporting point data space, and $l_d$ and $\sigma_f$ correspond to the hyperparameters from the model training, namely the length scale and the amplitude factor. Vector $Q_y$ is a variable calculated from the hyperparameters and the training data. Furthermore, $m_y$ corresponds to the mean value function with respect to a mean value of the output values of the supporting point data and $s_y$ corresponds to the variance of the output values of the supporting point data.

The input and output scaling is carried out, since the calculation of the Gaussian process model typically takes place in a scaled space.

At the start of a calculation, in particular computing unit 2 may instruct local DMA unit 34 or further DMA unit 6 to transfer the configuration data relating to the function model to be calculated into model calculation unit 3 and to start the calculation, which is carried out with the aid of the configuration data. The configuration data include the hyperparameters of a Gaussian process model and supporting point data, which are preferably specified with the aid of an address pointer on the address area of internal memory 5 assigned to model calculation unit 3. In particular, SRAM memory 33 for model calculation unit 3, which may be situated in particular in or on model calculation unit 3, may also be used for this purpose. Internal memory 5 and SRAM memory 33 may also be used in combination.

The calculation in model calculation unit 3 is carried out in a hardware architecture of model calculation unit 3, which is implemented by the following pseudocode and which corresponds to the above calculation guideline. It is apparent from the pseudocode that calculations are carried out in an inner loop and an outer loop and the partial results thereof are accumulated. At the beginning of a model calculation, a typical value for a counter start variable is Nstart 0.

```
/* Step 1: input scaling */
for (k=vInit; k<D; k++) {
x̄ [k] = x[k]*s_x[k]+ m_x[k];
}
/* Step 2: calculate outer loop */
for (j=Nstart; j<N; j++) {
i = j * D;
/* Step 2a: calculate inner loop */
t = 0.0;
for (q=0; q<D; q++) {
d = x̄ [q]– X[i+1];
d = d*d;
t += F [q]*d;
}
/* Step 2b: calculate exponential function */
e = exp(–t);
/* Step 2c: */
y += Q_y[j] * e;
}
/* Step 3: output scaling */
z = m_y;
z += y*s_y;
return z;
```

The model data required for calculating a data-based function model thus include hyperparameters and supporting point data, which are stored in a memory area in the memory unit assigned to the relevant data-based function model. According to the above pseudocode, the variables for calculating data-based function models include the scaling parameters, which are defined for each dimension, s_x (corresponds to $s_x$), m_x (corresponds to $m_x$), s_y (corresponds to $s_y$), m_y (corresponds to $m_y$), parameter vector Q_y (corresponds to $Q_y$), scaled training data X, number N of the supporting points, number D of the dimensions of the input variables, a starting value nStart of an outer loop, a loop index vInit in the event of a resumption of the calculation of the inner loop (normally=0), and length scale I for each of the dimensions of the input variables.

In integrated control modules, functional values of the Gaussian process model defined by hyperparameters and supporting point data are generally calculated. Furthermore, it may be necessary, depending on the implemented function in integrated control module 1, to calculate an inverted function, for a given output value $y_a$ and established input data $x_1, x_2, \ldots, x_{p-1}, x_{p+1}, \ldots, x_D$, the value of $x_p$ is to be calculated so that $$y(x)=y(x_1,x_2, \ldots ,x_D)=y_a$$

results.

Since the function of y(x) generally is not invertible, a method for zero point determination, in particular a Newtonian method for solving the inverse problem, may be used. The Newtonian method provides searching for the zero points of the function $$f(x)=y(x)-y_a$$

To find the zero points of the real value function, the Newtonian method provides an iteration process, n corresponding to the nth iteration:

$$x_p^{n+1} = x_p^n - \frac{f(x)}{f'(x)}$$

In the nth iteration, an update of $x_p^{n+1}$ is thus obtained. Function f(x) and its derivative f'(x) are thus evaluated at input point $x=x_1, x_2, \ldots, x_p^n, \ldots, x_D$. Three cases may be differentiated in the calculation of the function value of the data-based function model and the first derivative of the data-based function model at input vector x.

The first case relates to the situation in which the sets of supporting point data points $X^{(k)}$ and $Y^{(k)}$ are not scaled for the kth data-based partial function model in each case.

Proceeding from a specific example having a linear mean value function and two data-based partial function models (Gaussian process models), the gradient of the data-based function model is calculated. The procedure may be expanded arbitrarily to more than two partial function models. The data-based function model is described as follows:

$$\begin{aligned} f(x) &= ax + c + y_2(x) + y_3(x) - y_a \\ &= m_3(x) + \sum_{i=1}^{N} g_i(x) + \sum_{j=1}^{M} h_j(x) - y_a \\ &= a_1x_1 + a_2x_2 + a_3x_3 + c + \\ &\sum_{i=1}^{N} \sigma_f^{(2)}(Q_y^{(2)})_i \exp\left(-\frac{1}{2}\sum_{d=1}^{D}\frac{(x_d - X_{i,d}^{(2)})^2}{l_d^{(2)}}\right) + \\ &\sum_{j=1}^{M} \sigma_f^{(3)}(Q_y^{(3)})_j \exp\left(-\frac{1}{2}\sum_{d=1}^{D}\frac{(x_d - X_{j,d}^{(3)})^2}{l_d^{(3)}}\right) - y_a \end{aligned}$$

$g_i(x)$ and $h_i(x)$ corresponding to data-based partial function models, $\sigma_f^{(k)}$, $(Q_y^{(k)})_i$, $l_d^{(k)}$ corresponding to hyperparameters or the parameters derived therefrom of the kth Gaussian process model, $y_a$ corresponding to the target value, $m_1(x)=a_1x_1+a_2x_2+a_3x_3+c$ corresponding to the mean value function, and $x^{(k)}$ corresponding to the supporting point data. First partial derivative f'(x) at $x_p$ is:

$$f'(x) = \frac{\partial}{\partial x_p} f(x)$$

-continued $$= \frac{\partial}{\partial x_p}(ax + c + y_2(x) + y_3(x) - y_a)$$

$$= a_p + \sum_{i=1}^{N} g_i(x)\cdot\left(-\frac{x_p - X_{i,d}^{(2)}}{l_p^{(2)}}\right) + \sum_{j=1}^{M} h_j(x)\cdot\left(-\frac{x_p - X_{j,p}^{(3)}}{l_p^{(3)}}\right)$$

In a second case, the training data sets are scaled. One difficulty in the case of the use of scaled data for training the summation model including individual Gaussian process models is that for each partial model, the parameters for the scaling, i.e., standard deviation $\sigma_X^{(k)}$, $\sigma_Y^{(k)}$ and mean value of the data $\overline{X}^{(k)}, \overline{Y}^{(k)}$ are different for different models k, which results in different scaling in each case. It is therefore not possible to carry out the entire calculation in the scaled value space and then transform back the result, since uniform $\sigma_X$, $\sigma_Y$ or $\overline{X}, \overline{Y}$ do not exist for all measured supporting point data $X^{(k)}, Y^{(k)} \forall k$. Since the Gaussian process models are trained using scaled data, it is therefore necessary to carry out the calculations in the scaled value space, since the hyperparameters thereof have been trained for the scaled data. In the case of various scaling parameters for each Gaussian process model, $x^{(k)}$ indicates that input vector x is scaled using $\sigma_X^{(k)}$ and $\overline{X}^{(k)}$.

By way of the use of non-scaled data for training the Gaussian process model, the value of $f(x)=ax+c+y_2(x)+y_3(x)-y_a$ is obtained. By way of the use of scaled data for training the Gaussian process model, the function value of function f(x) is calculated by back-scaling of each function value of the Gaussian process model using its corresponding scaling parameters. The linear mean value function does not use scaled data, no back-scaling is therefore necessary for it. Therefore, the following equation is obtained for function value f(x):

$$f(x) = ax + c + y_2(x) + y_3(x) - y_a$$

$$= a + c + y_2(x^{(2)})\cdot\sigma_{Y(2)} + \overline{Y^{(2)}} + y_3(x^{(3)})\cdot\sigma_{Y(3)} + \overline{Y^{(3)}} - y_a$$

The difference between $y_2(x)$ and $y_2(x^{(2)})$ here is that the first expression means that the first Gaussian process model has a non-scaled input vector x and the model has been trained on non-scaled data, while in contrast the second expression means that input vector $x^{(2)}$ has been scaled using scaling parameters $\sigma_x^{(2)}$ and $\overline{X}^{(2)}$. The corresponding Gaussian process model has been trained using scaled data and result $y_2(x^{(2)})$ is the scaled estimated value.

First derivative f'(x) then reads:

$$f'(x) = \frac{\partial}{\partial x_p} f(x)$$

$$= \frac{\partial}{\partial x_p}\left[\begin{array}{l} ax + c + y_2\left(\frac{x - \overline{X^{(2)}}}{\sigma_{X(2)}}\right)\cdot\sigma_{Y(2)} + \overline{Y^{(2)}} + \\ y_3\left(\frac{x - \overline{X^{(3)}}}{\sigma_{X(3)}}\right)\cdot\sigma_{Y(3)} + \overline{Y^{(3)}} - y_a \end{array}\right]$$

$$= a_p + \sum_{i=1}^{N} g_i(x^{(2)})\cdot\left(-\frac{x_p^{(2)} - X_{i,p}^{(2)}}{l_p^{(2)}}\right)\cdot\frac{\sigma_{Y(2)}}{(\sigma_{X(2)})_p} + \sum_{j=1}^{M} h_j(x^{(3)})\cdot\left(-\frac{x_p^{(3)} - X_{j,p}^{(3)}}{l_p^{(3)}}\right)\cdot\frac{\sigma_{Y(3)}}{(\sigma_{X(3)})_p}$$

The inputs of the two Gaussian process models $x^{(2)}$ and $x^{(3)}$ differ since each Gaussian process model has its own scaling. Since vector X is D-dimensional, the standard deviation of dimension p of the second partial function model is specified by $(\sigma_{X(2)})_p$.

In a third case, the training data set is Box-Cox transformed with respect to the outputs using function b(y) and X is scaled. The calculation may also be carried out using an arbitrary number of data-based partial function models in the third case.

Function f(x) is specified in this case by:

$$f(x)=b^{-1}(b(m_1(x))+y_2(x)+y_3(x))-y_a.$$

The additive Gaussian process models have been trained using scaled and Box-Cox transformed training data. Linear mean value function $m_1(x)$ uses non-scaled input vector x as an input. This results in $$f(x)=b^{-1}(m_1(x))+y_2(x^{(2)})\cdot\sigma_{Y(2)}+\overline{Y^{(2)}}+y_3(x^{(3)})\cdot\sigma_{Y(3)}+\overline{Y^{(3)}})-y_a.$$

In this formula, $\sigma_{Y(2)}$ and $\overline{Y}^{(2)}$ correspond to the standard deviation and the mean value of Box-Cox-transformed data $\overline{b}(\overline{Y})^{(2)}$. The first derivative is a function of Box-Cox transformation b(•) and its inverse $b^{-1}$(•) and therefore may not be represented in a general form. For this reason, f'(x) is derived for various Box-Cox transformations. Thereafter, only x is not scaled, while the other data $x^{(2)}$, $x^{(3)}$ are scaled in accordance with their particular scaling parameters. Functions $y_2$(•), $y_3$(•), . . . are trained with the aid of scaled X and Box-Cox transformed and scaled Y.

The following formula results:

$$f(x) = \exp\left(\log(ax + c) + y_2(x^{(2)})\cdot\sigma_{Y(2)} + \overline{Y^{(2)}} + y_3(x^{(3)})\cdot\sigma_{Y(3)} + \overline{Y^{(3)}}\right) - y_a$$

$$= (ax + c)\cdot\exp\left(y_2(x^{(2)})\cdot\sigma_{Y(2)} + \overline{Y^{(2)}} + y_3(x^{(3)})\cdot\sigma_{Y(3)} + \overline{Y^{(3)}}\right) - y_a$$

$$f'(x) = a_p\cdot\exp(A) + (ax + c)\cdot\exp(A)\cdot\left(f_2'(x^{(2)})\cdot\frac{\sigma_{Y(2)}}{(\sigma_{X(2)})_p} + f_3'(x^{(3)})\cdot\frac{\sigma_{Y(3)}}{(\sigma_{X(3)})_p}\right)$$

where $$A = y_2(x^{(2)})\cdot\sigma_{Y(2)} + \overline{Y^{(2)}} + y_3(x^{(3)})\cdot\sigma_{Y(3)} + \overline{Y^{(3)}}$$

This corresponds to a Box-Cox transformation using log(y). For other Box-Cox transformations, the derivation of f'(x) is similar.

For the Newtonian algorithm, two essential expressions are to be calculated, namely f(x) and f'(x). For the first case, that supporting point data X and Y are not scaled, the calculation of f(x) is possible by way of the calculation of model calculation unit 3 of integrated control module 1. Only $y_a$ must be subtracted, i.e., input value y, for the inverse problem. Alternatively, $y_a$ may be integrated into mean value model parameters a and c, by reducing c by $y_a$.

The formula $$f'(x) = \frac{\partial}{\partial x_p} f(x)$$

$$= \frac{\partial}{\partial x_p}(ax + c + y_2(x) + y_3(x) - y_a)$$

$$= a_p + \sum_{i=1}^{N} g_i(x)\cdot\left(-\frac{x_p - X_{i,p}^{(2)}}{l_p^{(2)}}\right) + \sum_{j=1}^{M} h_j(x)\cdot\left(-\frac{x_p - X_{j,p}^{(3)}}{l_p^{(3)}}\right)$$

corresponds to the formula for calculating the derivative of a function value, which contains a linear mean value function and two additive Gaussian process models. For each data-based partial function model (error model), the derivative may be calculated as a weighted calculation in model calculation unit 3 of the error model at test point x, the weights being dependent on x. Parameter value $Q_y$ specifies the product of the inverse of a covariance matrix of the training data, to which noise is applied on the diagonal, with the vector of the associated output values, and may be replaced, inter alia, rapidly during the calculation in model calculation unit 3. Therefore, the following formula may be used for calculating the derivative (in the case of two additive data-based partial function models):

$$f'(x) = a_p + \underbrace{\sum_{i=1}^{N} g_i(x)\cdot\left(-\frac{x_p - X_{i,p}^{(2)}}{l_p^{(2)}}\right)}_{*} + \underbrace{\sum_{j=1}^{M} h_j(x)\cdot\left(-\frac{x_p - X_{j,p}^{(3)}}{l_p^{(3)}}\right)}_{**}$$

The terms (*) and () may each be calculated by model calculation unit 3**. Between the two calculations, only parameter vector $Q_y^{(k)}$ of the kth data-based partial function model must be adapted, $Q_y^{(k)}$ being provided in $g_i(x)$ or in $h_j(x)$. For this purpose, the ith entry of parameter vector $Q_y^{(k)}$ is adapted, by multiplying it with weighting factor $w_i(x)$, where $$w_i(x) = \left(-\frac{x_p - X_{i,p}^{(k)}}{l_p^{(k)}}\right) = -\frac{x_p}{l_p^{(k)}} + \frac{X_{i,p}^{(k)}}{l_p^{(k)}}$$

Since $w_i(x)$ is dependent on x and the pth component of x changes over the course of the iterations, $w_i(x)$ and therefore parameter vector $Q_y^{(k)}$ must be changed in each calculation step i. It is thus necessary that parameter vector $Q_y^{(k)}$ may be changed rapidly during the calculation. For the calculation in model calculation unit 3, the following formula therefore results $$\Sigma_{i=1}^{N} g_i(x)\cdot w_i(x)$$

the calculation being carried out on the basis of changing parameter vectors $Q_y^{(k)}$.

If the (on-the-fly) updating of parameter vector $Q_y^{(k)}$ is not possible, the calculation may be carried out by rewriting the formula $$\begin{aligned} f'(x) &= \frac{\partial}{\partial x_p}(ax + c + y_2(x) + y_3(x) - y_a) \\ &= a_p + \sum_{i=1}^{N} g_i(x)\cdot\left(-\frac{x_p - X_{i,p}^{(2)}}{l_p^{(2)}}\right) + \sum_{j=1}^{M} h_j(x)\cdot\left(-\frac{x_p - X_{j,p}^{(3)}}{l_p^{(3)}}\right) \end{aligned}$$

into the following expression $$f'(x) = a_p + \frac{1}{l_p^{(2)}}\left(\sum_{i=1}^{N} g_i(x)\cdot(-x_p) + \sum_{i=1}^{N} g_i(x)\cdot X_{i,p}^{(2)}\right) + \frac{1}{l_p^{(3)}}\left(\sum_{j=1}^{M} h_j(x)\cdot(-x_p) + \sum_{j=1}^{M} h_j(x)\cdot X_{j,p}^{(3)}\right)$$

Two calculations are carried out as follows in model calculation unit 3, as shown in FIG. 2. The calculation for the first error model is shown hereafter. The calculations for further error models run similarly:

A first calculation (step S1)

$$\Sigma_{i=1}^{N} g_i(x) = y(x)$$

in one of computing cores 31, 32 is followed by a subsequent software multiplication by $-x_p$ in main computing unit 2 (step S2)

$$\Sigma_{i=1}^{N} g_i(x)\cdot(-x_p)$$

and a subsequent calculation (step S3) in model calculation unit 3 using a changed parameter vector $Q_y^{(k)}$, which is ascertained by the element by element multiplication of existing parameter vector $Q_y^{(k)}$ with $X_{i,p}^{(k)}$ $$\Sigma_{i=1}^{N} g_i(x)\cdot X_{i,p}^{(2)}$$

The calculations in model calculation unit 3 are necessary for the calculation of a calculation step. It is thus not necessary to change the model parameters during the running calculation.

During the calculation of the Newtonian method, the calculation of f(x) is carried out for each iteration. Therefore, the term $$\Sigma_{i=1}^{N} g_i(x)\cdot(-x_p)$$

only requires one multiplication and no additional calculation of model calculation unit 3. Since two model calculations are possible, the calculations of f(x) and f'(x) may be carried out for each iteration in parallel in computing cores 31, 32.

For the second case, that training data $X^{(k)}, Y^{(k)}$ are scaled, the formula $$\begin{aligned} f'(x) &= \frac{\partial}{\partial x_p} f(x) \\ &= \frac{\partial}{\partial x_p} ax + c + y_2\left(\frac{x - \overline{X^{(2)}}}{\sigma_{X^{(2)}}}\right)\cdot\sigma_{Y^{(2)}} + \overline{Y^{(2)}} + y_3\left(\frac{x - \overline{X^{(3)}}}{\sigma_{X^{(3)}}}\right)\cdot\sigma_{Y^{(3)}} + \overline{Y^{(3)}} \\ &= a_p + \sum_{i=1}^{N} g_i(x^{(2)})\cdot\left(\frac{(x_p - X_{i,p}^{(2)})^2}{l_p^{(2)}}\right)\cdot\frac{\sigma_{Y^{(2)}}}{(\sigma_{X^{(2)}})_p} + \\ &\quad \sum_{j=1}^{M} h_j(x^{(3)})\cdot\left(\frac{(x_p - X_{j,p}^{(3)})^2}{l_p^{(3)}}\right)\cdot\frac{\sigma_{Y^{(3)}}}{(\sigma_{X^{(3)}})_p} \end{aligned}$$

may be calculated as explained above using $$\Sigma_{i=1}^{N} g_i(x)\cdot w_i(x).$$

In this case, factor $w_i(x)$ is calculated on the scaled x value, i.e., on $X^{(2)}$ in the specified notation, in particular by the calculation using $s_y=\sigma_Y^2/(\sigma_Y^2)_p$. The descaling parameter is thus used to multiply the obtained result by the suitable factor.

If an online update of parameters of the model calculation is not possible, by rewriting the above formula into the following expression:

$$f'(x) = a_p + \frac{\sigma_{Y^{(2)}}}{l_p^{(2)}\cdot(\sigma_{X^{(2)}})_p}\cdot\left(\sum_{i=1}^{N} g_i(x)\cdot(-x_p) + \sum_{i=1}^{N} g_i(x)\cdot X_{i,p}^{(2)}\right) +$$

Figure 3:
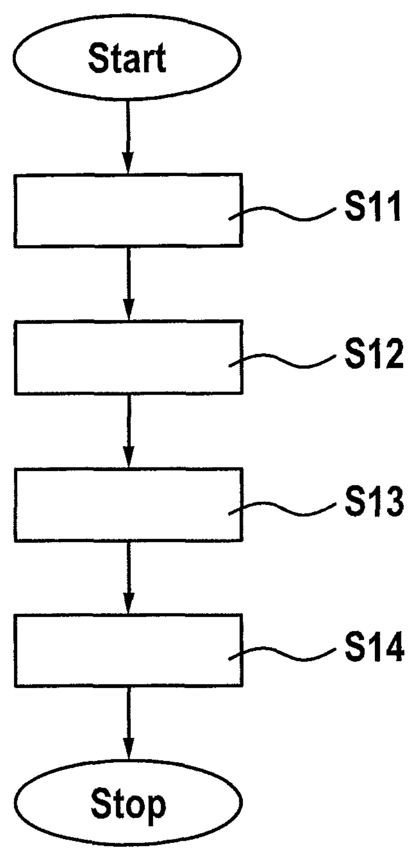
FIG. 3 shows a flow chart to illustrate an alternative method for ascertaining a gradient of the data-based function model.

-continued $$\frac{\sigma_{Y^{(3)}}}{l_p^{(3)}\cdot(\sigma_{X^{(3)}})_p}\left(\sum_{j=1}^{M} h_j(x)\cdot(-x_p)+\sum_{j=1}^{M} h_j(x)\cdot X_{j,p}^{(3)}\right)$$

the calculation may be carried out similarly as explained above, with the single difference of the multiplication by $$\frac{\sigma_{Y^{(2)}}}{l_p^{(2)}\cdot(\sigma_{X^{(2)}})_p}$$

or the suitable term for other Gaussian process models. The calculation is carried out for each data-based partial function model with the aid of two model calculations according to the following computing steps, which are schematically shown in FIG. 3. The following notation of the computing steps relates to the first error model; the calculation of the further error models takes place similarly:

$\Sigma_{i=1}^{N} g_i(x)=y(x)$ calculation in first computing core 31 (step S11)

$\Sigma_{i=1}^{N} g_i(x)\cdot(-x_p)$ multiplication in main computing unit 2 (step S12)

$\Sigma_{i=1}^{N} g_i(x)\cdot X_{i,p}^{(2)}$ calculation in second computing core 32 using changed $Q_y$ (step S13)

$$\frac{\sigma_{Y^{(2)}}}{l_p^{(2)}\cdot(\sigma_{X^{(2)}})_p}(\ \ldots\ )$$

multiplication of the result by this factor in software (step S14)

Figure 4:
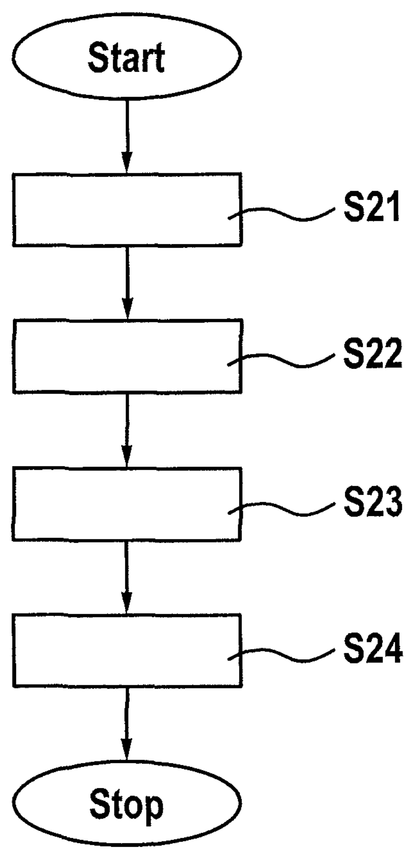
FIG. 4 shows a flow chart to illustrate an alternative method for ascertaining a gradient of the data-based function model.

For the third case, that for each data-based partial function model, outputs y of the training data are Box-Cox transformed using b(y) and the inputs of training data X are scaled, the following applies for f(x) and f'(x):

$$f(x)=(ax+c)\cdot\exp\left(y_2(x^{(2)})\cdot\sigma_{Y^{(2)}}+\overline{Y^{(2)}}+y_3(x^{(3)})\cdot\sigma_{Y^{(3)}}+\overline{Y^{(3)}}\right)$$

$$f'(x)=a_p\cdot\exp(A)+(ax+c)\cdot\exp(A)\cdot\left(f^{(2)\prime}(x^{(2)})\cdot\frac{\sigma_{Y^{(2)}}}{(\sigma_{X^{(2)}})_p}+f^{(3)\prime}(x^{(3)})\cdot\frac{\sigma_{Y^{(3)}}}{(\sigma_{X^{(3)}})_p}\right),$$

where $$A=y_2(x^{(2)})\cdot\sigma_{Y^{(2)}}+\overline{Y^{(2)}}+y_3(x^{(3)})\cdot\sigma_{Y^{(3)}}+\overline{Y^{(3)}},$$

the Box-Cox transformation corresponding to b(y)=log(y). f(x) is calculated as follows:

A calculation in first computing core 31 exp(A) calculation in main computing unit 2 in software (ax+c) calculation of the mean value function in main computing unit 2 in software Gradient f'(x) of the function model is calculated as follows, as schematically shown in FIG. 4:

A calculation in first computing core 31 (step S21)

exp(A) calculation in main computing unit 2 in software (step S22)

(ax+c) calculation of the mean value function in main computing unit 2 in software (step S23)

$$f_2'(x^{(2)})\cdot\frac{\sigma_{Y^{(2)}}}{(\sigma_{X^{(2)}})_p},\ \ldots$$

multiplication of the result by this factor in software (step S24)

Since in particular term A is used for the calculation of both f(x) and f'(x), only a single calculation is sufficient in model calculation unit 3.

What is claimed is:

1. A method for calculating an inverse data-based function model of a data-based function model having at least one accumulated data-based partial function model, comprising:

calculating, in only hardware using a first hardware core of a multi-core model calculation unit, a function value of the data-based function model having an exponential function, at least one summation function, and at least one multiplication function in two loop operations in a hardware-based way; and calculating, in only hardware using a second hardware core of the multi-core model calculation unit, a gradient of the data-based function model for a desired value of a predefined input variable;

wherein the calculating, using the first hardware core of the multi-core model calculation unit, the function value of the data-based function model, and the calculating, using the second hardware core of the multi-core model calculation unit, the gradient of the data-based function model, are carried out in parallel;

calculating the inverse data-based function model depending on both the function value of the data-based function model and the gradient of the data-based function model;

wherein the inverse data-based function model calculates, for a given output value of the data-based function model, an input value of the data-based function model.

2. The method as recited in claim 1, wherein:

each of the data-based partial function models of the data-based function model is defined by supporting point data, hyperparameters, and a parameter vector having a number of elements which corresponds to the number of the supporting point data points of the relevant data-based partial function model; and the data-based function model is modified to calculate the gradient of the data-based function model by applying a weighting vector, which is dependent on supporting point data points, to the parameter vector.

3. The method as recited in claim 2, wherein the gradient of the data-based function model is calculated by the model calculation unit as a function value of the modified data-based function model for the desired value of the predefined input variable, and an offset value is added.

4. The method as recited in claim 3, wherein the supporting point data points are scaled and the sum of the function value of the modified data-based function model and the offset value are multiplied by a factor which is based on the standard deviation of the supporting point data with regard to the output data, to obtain the gradient of the data-based function model.

5. The method as recited in claim 3, wherein a weighting vector, which is dependent on supporting point data points, is applied repeatedly to the parameter vector during a calculation of the modified data-based function model.

6. The method as recited in claim 1, wherein:

each of the data-based partial function models of the data-based function model is defined by supporting point data, hyperparameters, and a parameter vector, the parameter vector containing a number of elements which corresponds to the number of the supporting point data points; and the data-based function model is modified to calculate the gradient of the data-based function model with respect to a predefined input variable by calculating the function value of the data-based function model in the model calculation unit for a desired value of the predefined input variable, multiplying the result by the desired value of the predefined input variable, and subsequently carrying out a renewed calculation of the data-based function model using a changed parameter vector in the model calculation unit.

7. The method as recited in claim 1, wherein the calculation of the function value of the data-based function model, and the calculation of the gradient of the data-based function model, are implemented in only hardware in permanently wired fashion.

8. A control module for calculating an inverse data-based function model of a data-based function model having at least one accumulated data-based partial function model, comprising:

a main computing unit; and a multi-core model calculation unit having a first hardware core configured to calculate in only hardware function values of the data-based function model having an exponential function, summation functions, and multiplication functions in two loop operations, and a second hardware core configured to calculate in only hardware a gradient of the data-based function model for a desired value of a predefined input variable;

wherein the first hardware core of the multi-core model calculation unit carries out the calculating of the function value of the data-based function model in parallel with the second hardware core of the multi-core model calculation unit calculating the gradient of the data-based function model;

wherein the control module is configured to calculate the inverse data-based function model depending on both the function value of the data-based function model and the gradient of the data-based function model;

wherein the inverse data-based function model calculates, for a given output value of the data-based function model, an input value of the data-based function model.

9. The control module of claim 8, wherein:

each of the data-based partial function models of the data-based function model is defined by supporting point data, hyperparameters, and a parameter vector having a number of elements which corresponds to the number of the supporting point data points of the relevant data-based partial function model; and the data-based function model is modified to calculate the gradient of the data-based function model by applying a weighting vector, which is dependent on supporting point data points, to the parameter vector.

10. The control module of claim 9, wherein the gradient of the data-based function model is calculated by the model calculation unit as a function value of the modified data-based function model for the desired value of the predefined input variable, and an offset value is added.

11. The control module of claim 10, wherein a weighting vector, which is dependent on supporting point data points, is applied repeatedly to the parameter vector during a calculation of the modified data-based function model.

12. The control module as recited in claim 8, wherein the calculation of the function value of the data-based function model, and the calculation of the gradient of the data-based function model, are implemented in only hardware in permanently wired fashion.

13. A non-transitory, computer-readable data storage medium storing a computer program having program codes which, when executed on a computer, perform a method for calculating an inverse data-based function model of a data-based function model having at least one accumulated data-based partial function model, the method comprising:

calculating, in only hardware using a first hardware core of a multi-core model calculation unit, a function value of the data-based function model having an exponential function, at least one summation function, and at least one multiplication function in two loop operations in a hardware-based way;

calculating, in only hardware using a second hardware core of the multi-core model calculation unit, a gradient of the data-based function model for a desired value of a predefined input variable;

wherein the calculating, using the first hardware core of the multi-core model calculation unit, the function value of the data-based function model, and the calculating, using the second hardware core of the multi-core model calculation unit, the gradient of the data-based function model, are carried out in parallel; and calculating the inverse data-based function model depending on both the function value of the data-based function model and the gradient of the data-based function model;

wherein the inverse data-based function model calculates, for a given output value of the data-based function model, an input value of the data-based function model.

14. The non-transitory, computer-readable data storage medium of claim 13, wherein:

each of the data-based partial function models of the data-based function model is defined by supporting point data, hyperparameters, and a parameter vector having a number of elements which corresponds to the number of the supporting point data points of the relevant data-based partial function model; and the data-based function model is modified to calculate the gradient of the data-based function model by applying a weighting vector, which is dependent on supporting point data points, to the parameter vector.

15. The non-transitory, computer-readable data storage medium of claim 14, wherein the gradient of the data-based function model is calculated by the model calculation unit as a function value of the modified data-based function model for the desired value of the predefined input variable, and an offset value is added.

16. The non-transitory, computer-readable data storage medium of claim 15, wherein a weighting vector, which is dependent on supporting point data points, is applied repeatedly to the parameter vector during a calculation of the modified data-based function model.

17. The non-transitory computer-readable data storage medium as recited in claim 13, wherein the calculation of the function value of the data-based function model, and the calculation of the gradient of the data-based function model, are implemented in only hardware in permanently wired fashion.

* * * * *